(12) United States Patent
Yoneyama

(10) Patent No.: US 7,340,358 B2
(45) Date of Patent: Mar. 4, 2008

(54) MEASUREMENT EQUIPMENT

(75) Inventor: Toshiaki Yoneyama, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 11/295,669

(22) Filed: Dec. 7, 2005

(65) Prior Publication Data
US 2006/0149498 A1 Jul. 6, 2006

(30) Foreign Application Priority Data
Dec. 10, 2004 (JP) ............ P. 2004-358160

(51) Int. Cl.
G01F 19/00 (2006.01)
G06F 7/70 (2006.01)
(52) U.S. Cl. .................... 702/67; 701/102
(58) Field of Classification Search ........... 702/189, 702/67; 701/102
See application file for complete search history.

(56) References Cited
U.S. PATENT DOCUMENTS
5,039,937 A * 8/1991 Mandt et al. ........ 324/121 R
5,935,187 A * 8/1999 Trsar et al. .............. 701/102
7,010,444 B2 * 3/2006 Nishikobara et al. ....... 702/69
2003/0220753 A1 * 11/2003 Pickerd et al. ............ 702/67

FOREIGN PATENT DOCUMENTS
JP 2004-245583 A 9/2004

* cited by examiner

Primary Examiner—John Barlow
Assistant Examiner—Victor J. Taylor
(74) Attorney, Agent, or Firm—Sughrue Mion, PLLC

(57) ABSTRACT

A measurement equipment has a polygonal line processing section and a computational processing section. The polygonal line processing section produces a polygonal line pattern signal based on a predetermined polygonal line pattern having a polygonal line value that varies according to a polygonal line time and a timer processing for the polygonal line time. The computational processing section executes a computational processing with using an external input signal and the polygonal line pattern signal.

3 Claims, 7 Drawing Sheets

| P | POLYGONAL LINE TIME SET VALUES | POLYGONAL LINE VALUE SET VALUES |
|---|---|---|
| P0 | t0 | v0 |
| P1 | t1 | v1 |
| P2 | t2 | v2 |
| P3 | t3 | v3 |

| P | POLYGONAL LINE TIME SET VALUES | POLYGONAL LINE VALUE SET VALUES |
|---|---|---|
| P0 | t0 | v0 |
| P1 | t1 | v1 |
| P2 | t2 | v2 |
| P3 | t3 | v3 |

MEASUREMENT EQUIPMENT

CROSS-REFERENCE TO RELATED APPLICATIONS

This application is based upon and claims the benefit of priority from the prior Japanese Patent Applications No. 2004-358160, filed on Dec. 10, 2004, the entire contents of which are incorporated herein by reference.

BACKGROUND OF THE INVENTION

1. Field of the Invention

The present invention relates to a measurement equipment having functions of receiving an external signal and computationally processing the signal. The measurement equipment obtains an event occurring in the field, and the like as data, executes a computational process on the data, stores the processed data into a database, and then outputs the data to an external medium, a recording sheet, or the like. The computational process section a general computation such as the four arithmetic operations, magnitude comparison, data integration, or data averaging.

2. Description of the Related Art

JP-A-2004-245583 is a related art relating to a measurement equipment having a computational processing function.

JP-A-2004-245583 is referred to as a related art.

FIG. 10 is a functional block diagram showing an example of the configuration of a related-art measurement equipment having a computational processing function. A block 1 is a measurement equipment having a computational processing function. The reference numerals 2a to 2n denote sensors in a field which respectively supply measurement values PVa to PNn to the measurement equipment 1, and the reference numeral 3 denotes a network. External signals from external PCs 4a to 4n connected to the network are supplied to the measurement equipment 1 via a communication line.

The reference numeral 5 denotes a user who operates the measurement equipment, reference numeral 6 denotes a recording sheet which is external outputting section for a computation result, reference numeral 7 denotes a recording medium such as an FD, reference numeral 8 denotes a display unit, and reference numeral 9 denotes an alarm device.

In the measurement equipment 1, reference numeral 11 denotes a panel card which interfaces with the operation of the user 5, reference numeral 12 denotes an A/D card which interfaces with the measurement values PVa to PNn, reference numeral 13 denotes an A/D processing section which converts an output of the A/D card to data for computational processing, reference numeral 14 denotes a communication I/F card which interfaces with communication with the network 3, and reference numeral 15 denotes a communication processing section which converts an output of the communication I/F card to data for computational processing.

The reference numeral 16 denotes a computational processing section which receives an operation signal from the panel card 11, and external signals from the A/D processing section 13 and the communication processing section 15, executes predetermined computations (addition, subtraction, magnitude comparison, integration, and the like of data), and stores results of the computations into a database 17.

The reference numeral 18 denotes a computation setting section which holds various preset values for computational processing, parameters, etc.

The reference numeral 19 denotes an outputting section. Data stored in the database 17 are output with using the outputting section as an interface to a recording sheet output card 20, an external medium card 21, a display card 22, or an alarm card 23, and further output externally to the recording sheet 6, the recording medium 7 such as an FD, the display unit 8, or the alarm device 9. The communication processing section 15 distributes the computation results to the external PCs 4a to 4n of the network 3 with using the outputting section 19 as an interface.

In the computational processing in the related-art measurement equipment, the input values depend on the external signals (field inputs and network inputs), and hence also computation results to be stored in the database are results which depend on the external signals. A related-art measurement equipment is not provided with section for, as computation results, storing a preset time-varying value independent of an external signal.

SUMMARY OF THE INVENTION

An object of the invention is to provide a measurement equipment including a section which computes with using a preset time-varying value independent of an external input.

The invention provides a measurement equipment, having: a polygonal line processing section which produces a polygonal line pattern signal based on a predetermined polygonal line pattern having a polygonal line value that varies according to a polygonal line time and a timer processing for the polygonal line time; and a computational processing section which executes a computational processing with using an external input signal and the polygonal line pattern signal.

In the measurement equipment, the polygonal line processing section has: a polygonal line setting section which stores polygonal line setting information showing a relationship between the polygonal line value and the polygonal line time of the polygonal line pattern; a polygonal line timer processing section which controls a lapse of the polygonal line time; and a polygonal line producing section which produces the polygonal line pattern signal based on the polygonal line setting information obtained from the polygonal line setting section and the timer processing by the polygonal line timer processing section.

In the measurement equipment, the polygonal line setting information is a table which defines a polygonal line time set value and a polygonal line value set value correlated with the polygonal line time set value.

In the measurement equipment, the polygonal line timer processing section executes at least one of the timer processing of clear, start, and stop, in response to instructions from a user of the measurement equipment.

In the measurement equipment, the external signal is a measurement value of a process or an input value obtained via a network.

According to the measurement equipment, the polygonal line value which is always identical is produced from the polygonal line pattern produced from polygonal points (configured by a polygonal line time and a polygonal line value) that are preset values, and a count value of a polygonal line timer. When the polygonal line value is used as an input of the computational process, it is possible to obtain a computation result having a pattern which is always constant.

Further, the polygonal line time can be cleared, started, and stopped in response to the instructions by the user. Therefore, the computation result which is always constant can be controlled by the user.

DETAILED DESCRIPTION OF THE PREFERRED EMBODIMENTS

Figure 1:
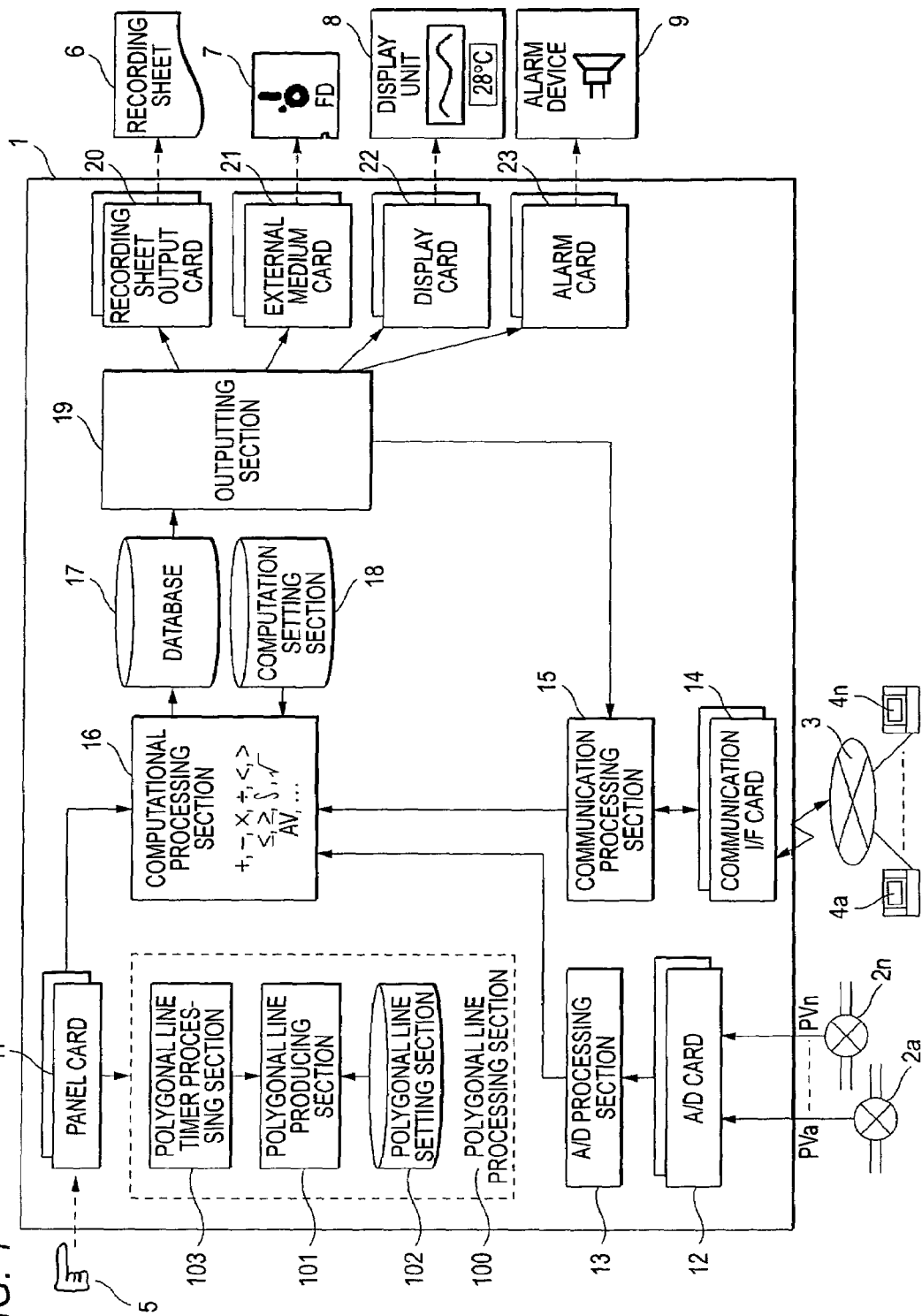
FIG. 1 is a functional block diagram showing an embodiment of a measurement equipment according to the invention.
Figure 10:
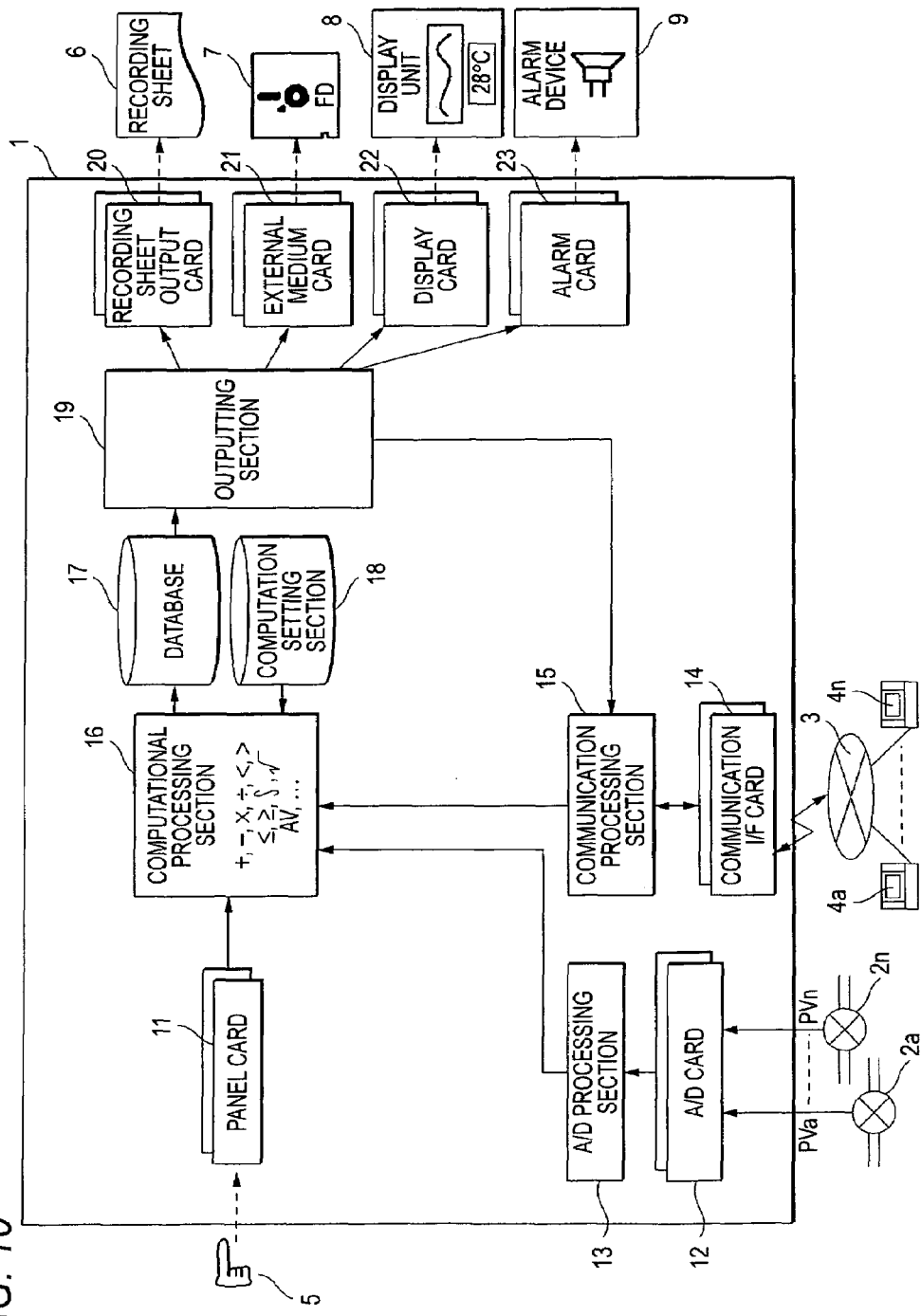
FIG. 10 is a functional block diagram showing an example of the configuration of a related-art measurement equipment having a computational processing function.

An embodiment of the invention will be described in detail with reference the accompanying drawings. FIG. 1 is a functional block diagram showing the embodiment of a measurement equipment according to the invention. The components which are identical with those of the related-art measurement equipment shown FIG. 10 are denoted by the same reference numerals, and their description is omitted. Hereinafter, characteristic portions of the invention are described.

The broken line block 100 is the polygonal line processing section which is newly added in the invention. The section has a function of inputting a preset time-varying value to the computational processing section 16 in addition to other external signals to enable a computational process with the external signals, thereby expanding the function of the measurement equipment relating to the computational process.

In the polygonal line processing section 100, the reference numeral 101 denotes a polygonal line producing section for obtaining a polygonal line preset value (polygonal point information in which settings of a time and a polygonal line value are used as one set) from a polygonal line setting section 102 to produce a polygonal line pattern, and for outputting a polygonal line value as an input value of the computational processing section 16 in accordance with a polygonal line time which is counted up, and which is supplied from polygonal line timer processing section 103.

The polygonal line timer processing section which is used in the polygonal line processing section can be cleared, started, and stopped by the user via the panel card 11.

Figures 2, 3:
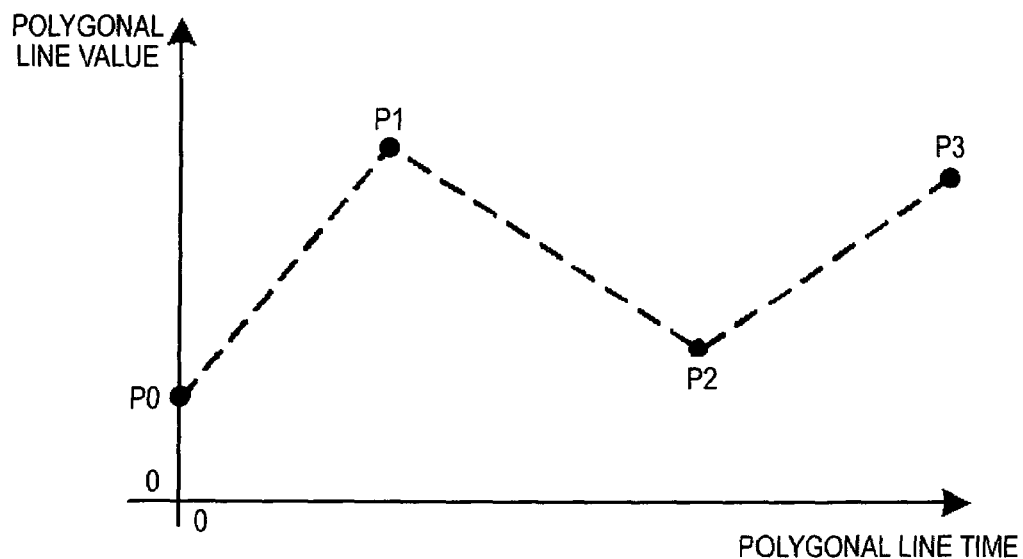
FIG. 2 is a characteristic diagram showing an example of a polygonal line pattern produced by a polygonal line processing section.
FIG. 3 is a table showing an example of contents of setting of the polygonal line setting section.

FIG. 2 is a characteristic diagram showing an example of the polygonal line pattern produced by the polygonal line producing section 101. In the characteristic diagram, the abscissa indicates the polygonal line time which is given from the polygonal line timer processing section 103, and the ordinate indicates the polygonal line value given by the setting of the polygonal line setting section 102.

FIG. 3 is a table showing an example of the contents of the setting of the polygonal line setting section 102. In the table, polygonal line time set values t0, t1, t2, t3 and polygonal line value set values v0, v1, v2, v3 are defined so as to respectively correspond to break points P0, P1, P2, P3.

Figure 4:
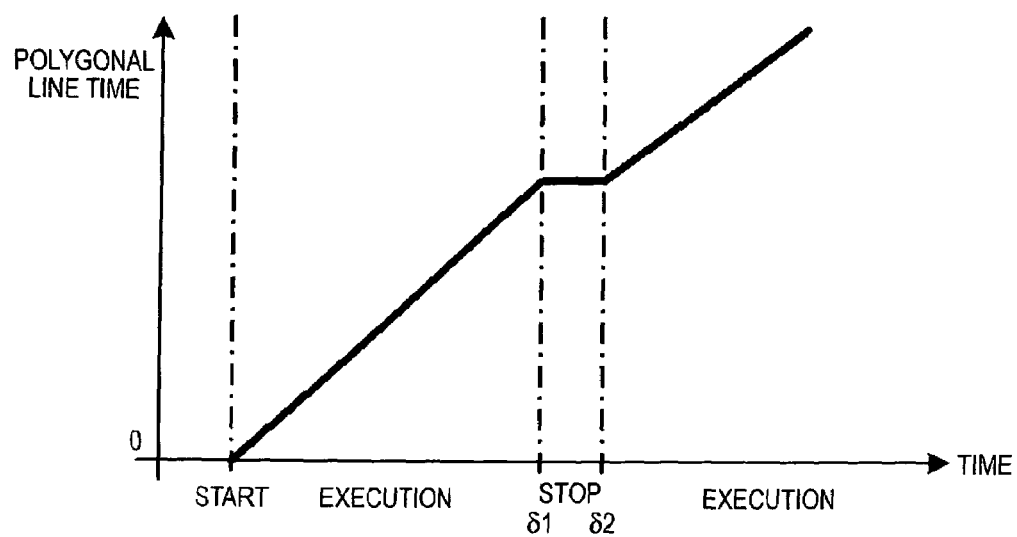
FIG. 4 is a characteristic diagram showing an example of a polygonal line time which is sent from a polygonal line timer processing section to the polygonal line producing section.

FIG. 4 is a characteristic diagram showing an example of the polygonal line time t which is sent from the polygonal line timer processing section 103 to the polygonal line producing section 101. This example shows the case where the operation is stopped at a time δ1 by an operation of the user 5, and started at a time δ2. During the period between the times δ1 and δ2, the increase of the polygonal line time t is suspended.

Figure 5:
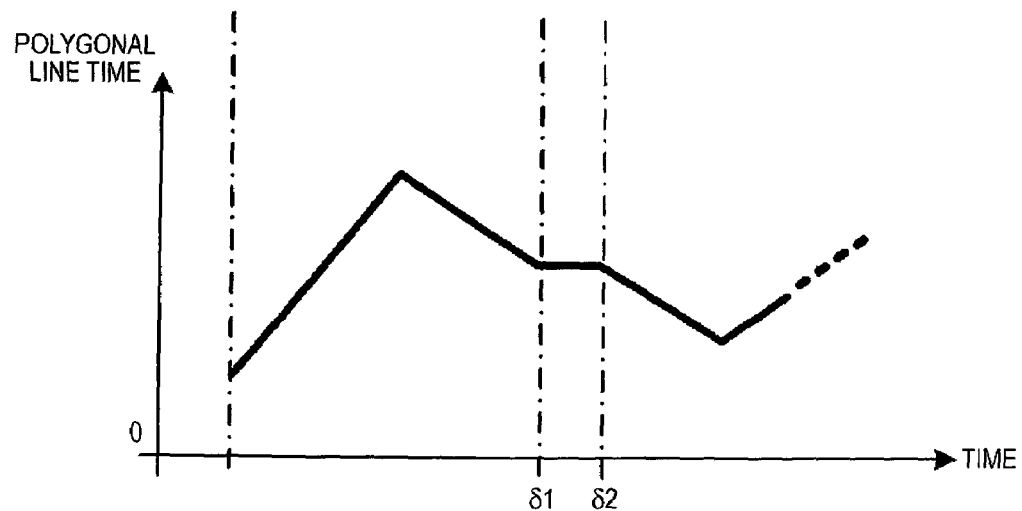
FIG. 5 is a characteristic diagram showing a change of a polygonal line value of the polygonal line producing section to which a polygonal line time of FIG. 4 is input.

FIG. 5 is a characteristic diagram showing a change of the polygonal line value of the polygonal line producing section 101 to which the polygonal line time of FIG. 4 is input. During the period between the times δ1 and δ2, the polygonal line value v maintains the value at the time δ1. After the time δ2, the value changes in accordance with the set value of the polygonal line setting section 102.

Figure 6:
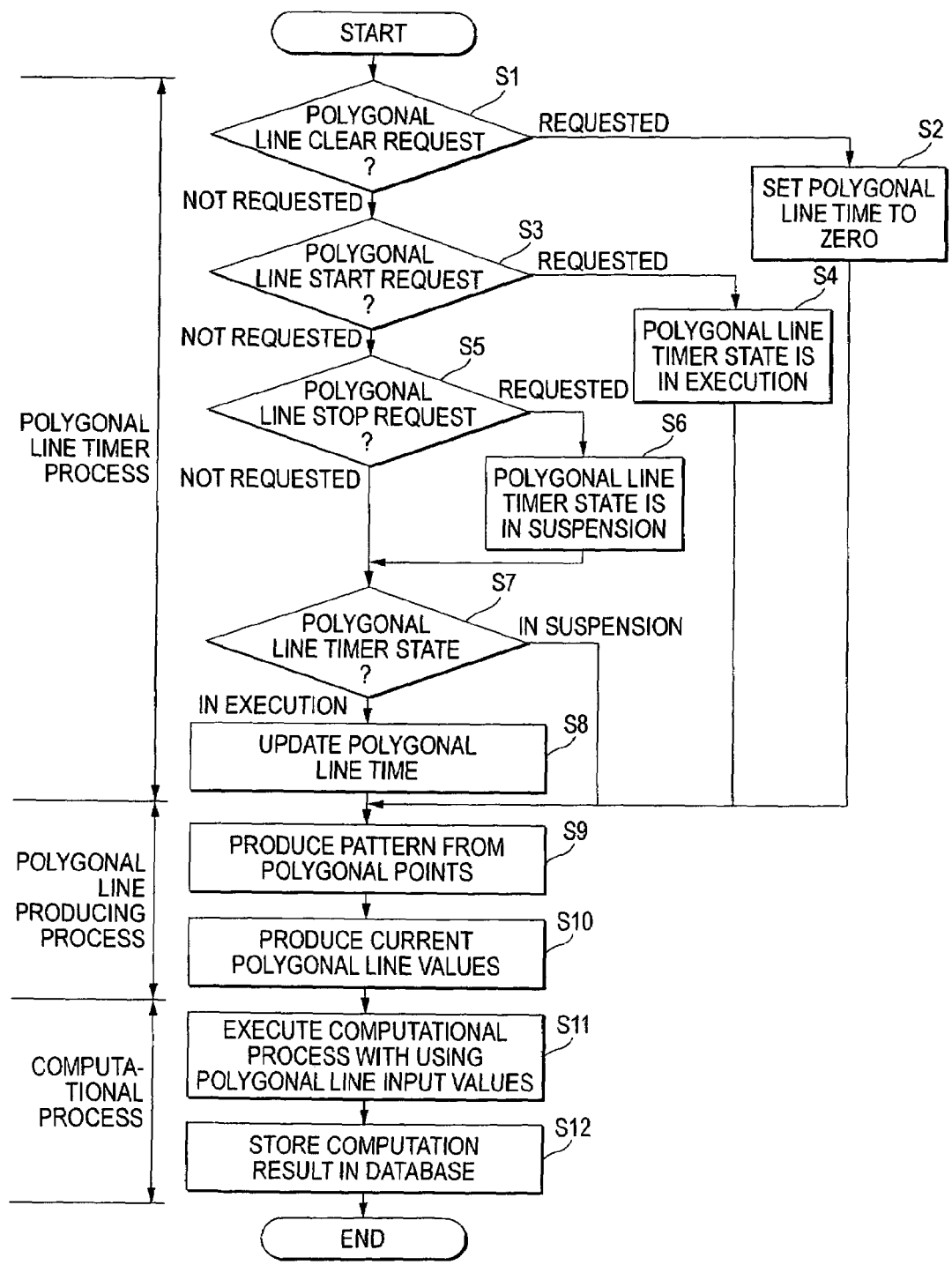
FIG. 6 is a flowchart illustrating a signal processing procedure of the measurement equipment of the invention to which a polygonal line signal is input.

FIG. 6 is a flowchart illustrating a signal processing procedure of the measurement equipment of the invention to which a polygonal line signal is input. Steps S1 to S8 correspond to a signal process of the polygonal line timer processing section, steps S9 and S10 correspond to a signal process of the polygonal line producing section, and steps S11 and S12 correspond to a signal process of the computational processing section.

When the process is started, a timer clear request from the user is checked in step S1. When there is a clear request, the polygonal line time is set in step S2 to zero, and the process then jumps to step S9. When there is not a clear request, the process advances to step S3.

In step S3, a polygonal line start request from the user is checked. When there is a polygonal line start request, the polygonal line timer state is set in step S4 to be in execution, and then the process jumps to step S9. When there is not a start request, the process advances to step S5.

In step S5, a polygonal line stop request from the user is checked. When there is a polygonal line stop request, the polygonal line timer state is set in step S6 to be in suspension, and then the process jumps to step S7. When there is not a stop request, the process advances to step S7 without executing an operation.

In step S7, the polygonal line timer state is checked. When the state is in execution, the polygonal line time is updated in step S8, and then the process advances to step S9. When the polygonal line timer state is in suspension, the process jumps to step S9.

The polygonal line producing section stores information of steps S1 to S8, produces a pattern based on the set values and the polygonal line times of the polygonal points, and produces in step S10 the polygonal line values which are exemplarily shown in FIG. 5. The polygonal line values are transmitted to the computational processing section.

In the computational processing section, a computational process is executed in step S11 with using the transmitted polygonal line input values. In step S12, a computation result is stored in the database, and then the process is ended.

The flowchart of FIG. 6 illustrates the case where the input to the computational processing section 16 is restricted to only the input value from the polygonal line processing section. Alternatively, the computational processing section 16 may execute mixed computation to which a polygonal line input value and an external signal are input.

A practical example of the mixed computation is as follows. In a related-art measurement equipment, with respect to an alarming function in which it is checked whether an A/D input value exceeds a reference value, the reference value is a constant value which is time-invariable (however, excluding a period when the setting of the alarm reference value is changed in mid-course). By contrast, when an A/D input value is compared with using such a polygonal line value as a reference value and the comparison result is used as an alarming function, it is possible to perform an alarming process in which the reference value is time-variable.

Figure 7:
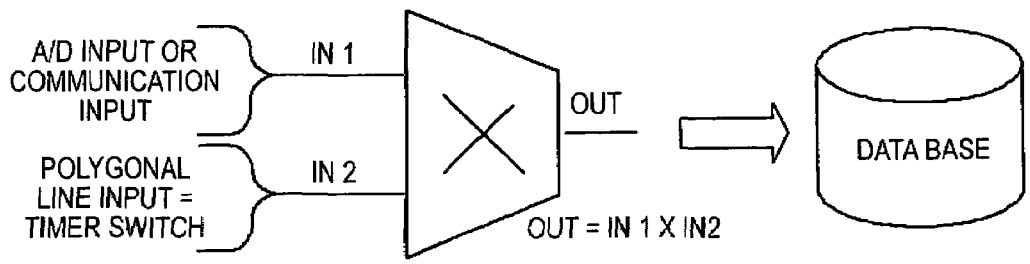
FIG. 7 is an image diagram showing another embodiment of the invention.

FIG. 7 is an image diagram showing another embodiment of the invention. In the embodiment, a computation output out which is obtained by multiplying an AD input or a communication input (in1) and a polygonal line input (in2) is stored in the database (out=in1×in2).

Figure 8:
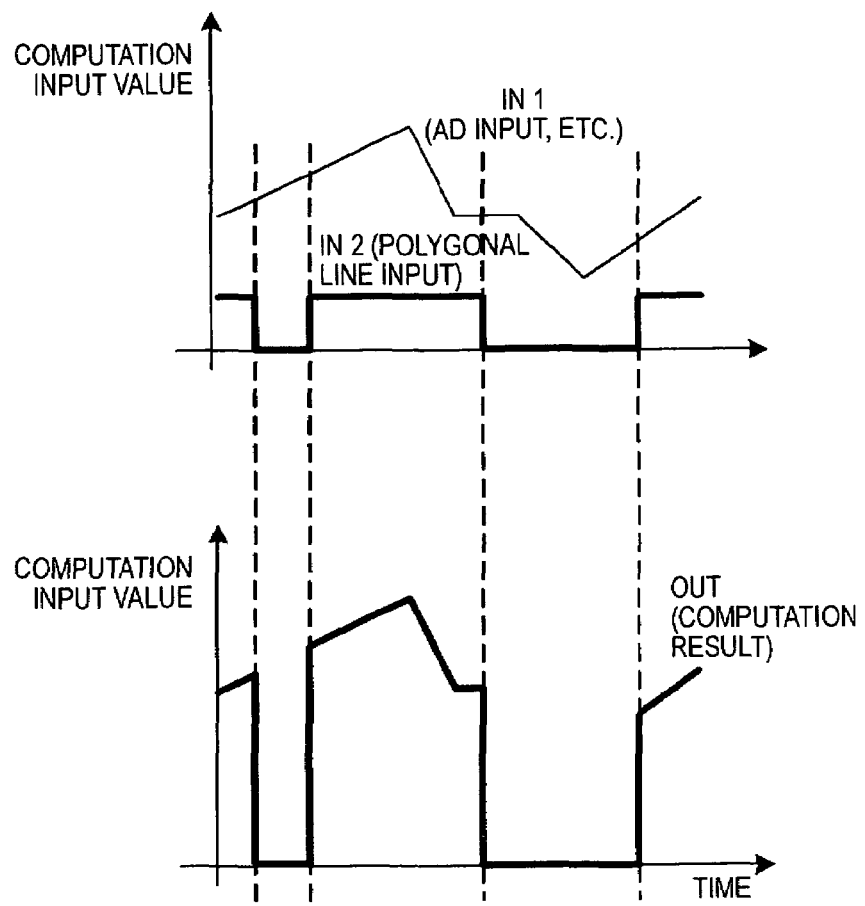
FIG. 8 is a waveform chart of computation input values (in1, in2) and a computation output in the configuration of FIG. 7.

FIG. 8 is a waveform chart of the computation input values (in1, in2) and the computation output in the configuration of FIG. 7. The embodiment is characterized in that the polygonal line input is given in the form of a binary signal consisting of ON and OFF periods, and substantially plays a role of a timer switch, thereby realizing computation in which the AD input or the communication input (in1) is compulsively made zero.

Figure 9:
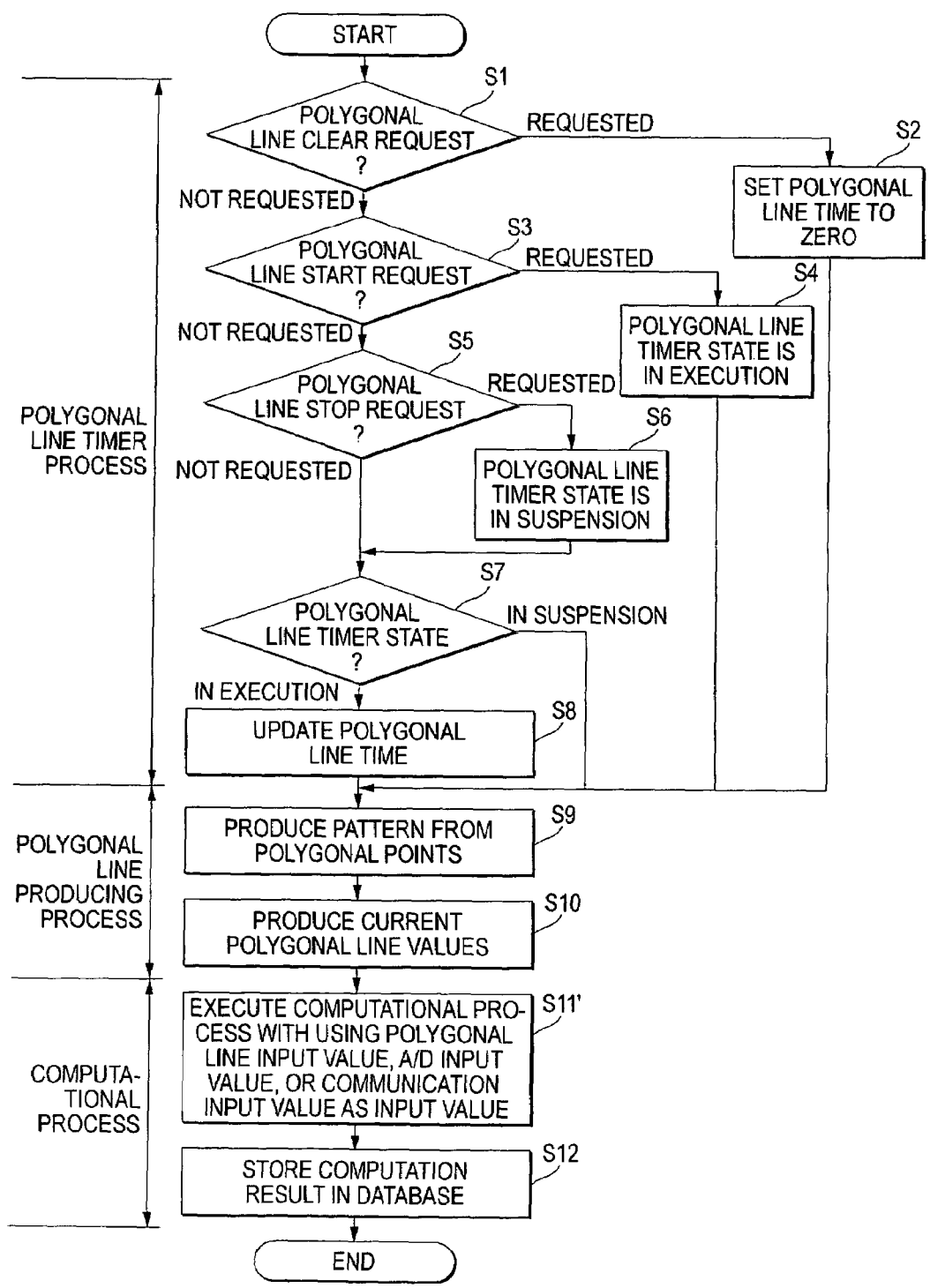
FIG. 9 is a flowchart illustrating a signal processing procedure in the case where computation is executed by the configuration of FIG. 7.

FIG. 9 is a flowchart illustrating a signal processing procedure in the case where computation is executed by the configuration of FIG. 7. The flowchart is basically identical with that shown in FIG. 6. However, step S11' in which a computational process is executed with using a polygonal line input value, an A/D input value, or a communication input value as an input value is different from step S11 of FIG. 6 (the computational process using only the polygonal line input).

What is claimed is:

1. A Measurement equipment comprising,
   a polygonal line processing section which produces a polygonal line pattern signal based on a specified polygonal line pattern having a polygonal line value that varies according to a polygonal line time and a timer processing for the polygonal line time; and
   a computational processing section which executes computational processing using an external input signal and the polygonal line pattern signal,
   wherein the polygonal line processing section comprises:
   a polygonal line setting section which stores polygonal line setting information showing a relationship between the polygonal line value and the polygonal line time of the polygonal line pattern;
   a polygonal line timer processing section which controls a lapse of the polygonal line time; and
   a polygonal line producing section which produces the polygonal line pattern signal based on the polygonal line setting information obtained from the polygonal line setting section and the timer processing by the polygonal line timer processing section, and
   wherein the polygonal line setting information is a table which defines a polygonal line time set value and a polygonal line value set value correlated with the polygonal line time set value.

2. The measurement equipment according to claim 1, wherein the polygonal line timer processing section executes at least one of the timer processing of clear, start, and stop, in response to instructions from a user of the measurement equipment.

3. The measurement equipment according to claim 1, wherein the external signal is a measurement value of a process or an input value obtained via a network.

* * * * *